United States Patent [19]
Leu et al.

[11] Patent Number: 6,166,435
[45] Date of Patent: Dec. 26, 2000

[54] FLIP-CHIP BALL GRID ARRAY PACKAGE WITH A HEAT SLUG

[75] Inventors: Fang-Jun Leu; Rong-Shen Lee; Hsin-Chien Huang, all of Hsinchu; Randy Hsiao-Yu Lo, Taipei; Chiang-Han Day, Hsinchu, all of Taiwan

[73] Assignee: Industrial Technology Research Institute, Hsinchu, Taiwan

[21] Appl. No.: 09/209,634

[22] Filed: Dec. 10, 1998

[51] Int. Cl.[7] ....................................... H01L 23/12
[52] U.S. Cl. .......................... 257/704; 257/707; 257/706; 257/718; 257/720; 257/719; 257/780
[58] Field of Search ..................................... 257/707, 706, 257/718, 704, 710, 719, 720, 778, 780, 738

[56] References Cited

U.S. PATENT DOCUMENTS

| | | | |
|---|---|---|---|
| 5,153,379 | 10/1992 | Guzuk et al. | 174/35 R |
| 5,917,702 | 6/1999 | Barrow | 361/704 |
| 5,977,626 | 11/1999 | Wang et al. | 257/707 |

*Primary Examiner*—Tom Thomas
*Assistant Examiner*—Luan Thai

[57] ABSTRACT

An extended flip chip ball grid array package includes a metal heat slug bonded to the surface of a semiconductor chip. The heat slug has a bonding structure for connecting itself and a BGA substrate panel on which the semiconductor chip is mounted. The heat slug protects the chip from being damaged as well as assists heat dissipation. A first package assembly provides contact bodies on the heat slug for bonding the heat slug to contact pads formed on a BGA substrate panel. A second package assembly fixes the heat slug to a supporting structure bonded on a BGA substrate panel. Supporting stubs are formed on the supporting structure and snapped in openings formed on the contact bodies of the heat slug. Conventional packaging or testing equipment can be used for both package assemblies to manufacture or test the semiconductor chip packages.

17 Claims, 10 Drawing Sheets

FLIP-CHIP BALL GRID ARRAY PACKAGE WITH A HEAT SLUG

FIELD OF THE INVENTION

The present invention relates generally to a semiconductor chip package, and more specifically to a flip-chip ball grid array package (BGA) having a heat slug.

BACKGROUND OF THE INVENTION

Semiconductor packages are used for protecting a semiconductor die in a package body, and providing connection points for connecting the packaged die to external devices. To cope with the high density and high pin-count of semiconductor chips, BGA and "flip chip" packages have been developed. In a typical BGA package, the semiconductor chip is mounted to the top surface of a printed circuit board type substrate. The chip is wire bonded to electrical traces in the substrate, then over-molded with an encapsulating material for protection. Solder balls are bonded to the electrical traces on the bottom surface of the substrate, serving as the external electrodes for surface mounting on a printed circuit board.

Flip chip packages are similar to BGA packages, except that the solder balls are attached directly to the bond pads or I/O pads formed on the surface of the chip. This results in a compact size of the flip chip packages. Because of the absence of an encapsulating material, flip chip packages are quite fragile and require careful assembly and handling techniques.

An example of a conventional flip chip BGA package that combines the durability of the BGA packages and the small size of the flip chip packages is shown in FIG. 1. In general, the conventional flip chip BGA package shown in FIG. 1 has some disadvantages. One is that chips are subject to damage because their top surfaces are exposed during testing or packaging steps. Another problem is that an external heat sink can not be easily and directly attached to the top surface of a chip. Furthermore, it is not easy to put an identification mark on the top surface of a chip.

SUMMARY OF THE INVENTION

This invention has been made to overcome the above mentioned drawbacks for flip chip BGA packages. It is an object of the present invention to provide an extended flip chip BGA package with a metal heat slug overlaying the upper surface of a semiconductor chip. According to the present invention, contact structures are provided for bonding the heat slug and a substrate panel on which the semiconductor chip is mounted. By having an externally attached heat slug with contact structures, the extended flip chip BGA package of the invention protects chips from being cracked and assists the dissipation of heat generated by the chip package.

Another object of the invention is to provide a chip package in which current standard plastic ball grid array (PBGA) packaging or testing equipment may be used. Using the standard packaging or testing equipment eliminates the high cost associated with purchasing additional specialized manufacturing equipment. Because the shape and the size of extended flip chip BGA package of the invention is the same as that of the current standard PBGA package, it is easy to test and assemble an extended flip chip BGA package of the invention during the manufacturing process of the package.

In accordance with the invention, a heat slug may be connected by gull win bonding to a BGA substrate panel for reducing the structural stress between the BGA substrate panel and the heat slug. From one aspect of the present invention, by means of appropriate material and structural design, the warpage of chip packages can be better controlled. According to another aspect of the present invention, the heat slug may be electrically connected to the substrate for providing electrical shielding effect.

In a first embodiment of the extended flip chip BGA package of this invention, a heat slug overlaying the upper surface of the flip chip BGA package is bonded to a BGA substrate panel by applying suitable material on a plurality of contact pads. Contact bodied are formed on the heat slug for bonding to the contact pads. Contact pads on the top surface of the BGA substrate panel may be connected to the ground of the chip circuit for providing electrical shield for the circuit.

In a second embodiment of the extended flip chip BGA package of this invention, a supporting structure having supporting stubs is bonded on the top surface of a BGA substrate. A heat slug overlaying the upper surface of the flip chip BGA package is fixed to the BGA substrate panel by means of the supporting stubs.

In a third embodiment of the extended flip chip BGA package of this invention, a plurality of smaller dies are mounted substantially in the center of the top surface of a BGA substrate. These dies are also uniformly located within the surrounding area of the contact pads of the first embodiment or the supporting stubs of the second embodiment.

The foregoing and other objects, features, aspects and advantages of the present invention will become more apparent from a careful reading of a detailed description provided herein below, with appropriate reference to the accompanying drawings.

BRIEF DESCRIPTION OF THE DRAWINGS

FIG. 4b shows the cross-sectional view and various dimensions of the example of the BGA chip package according to the first embodiment shown in FIG. 4a.

FIG. 7b shows the cross-sectional view and various dimensions of the example of BGA chip package according to the second embodiment shown in FIG. 7a.

DETAILED DESCRIPTION OF THE PREFERRED EMBODIMENTS

Figure 1:
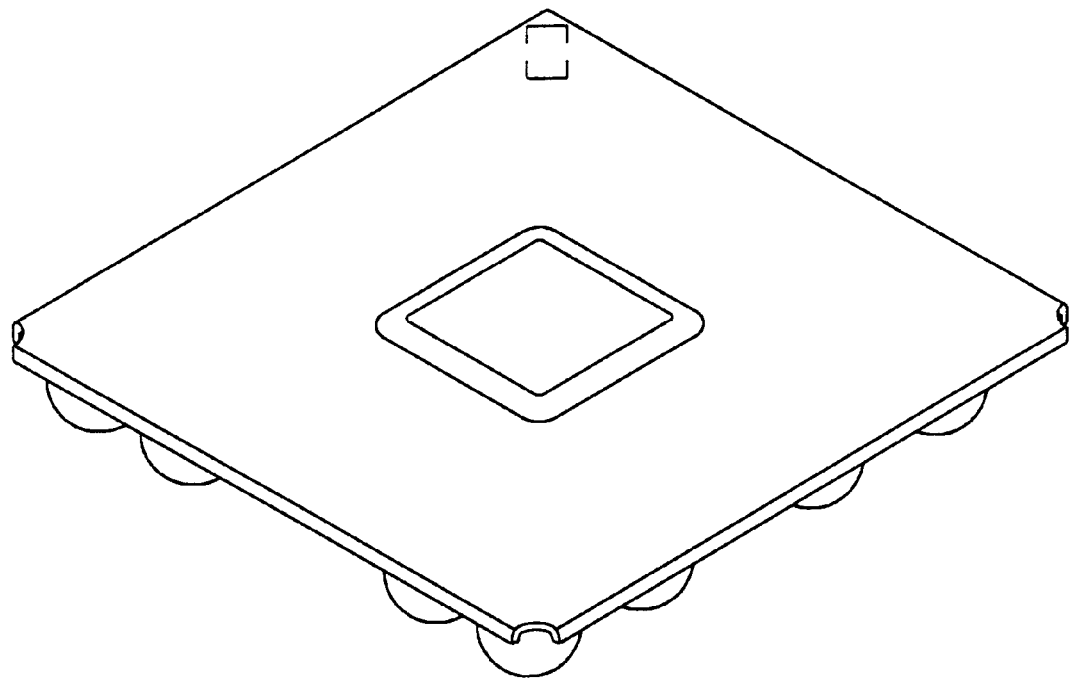
FIG. 1 illustrates a conventional flip chip ball grid array package.
Figure 2:
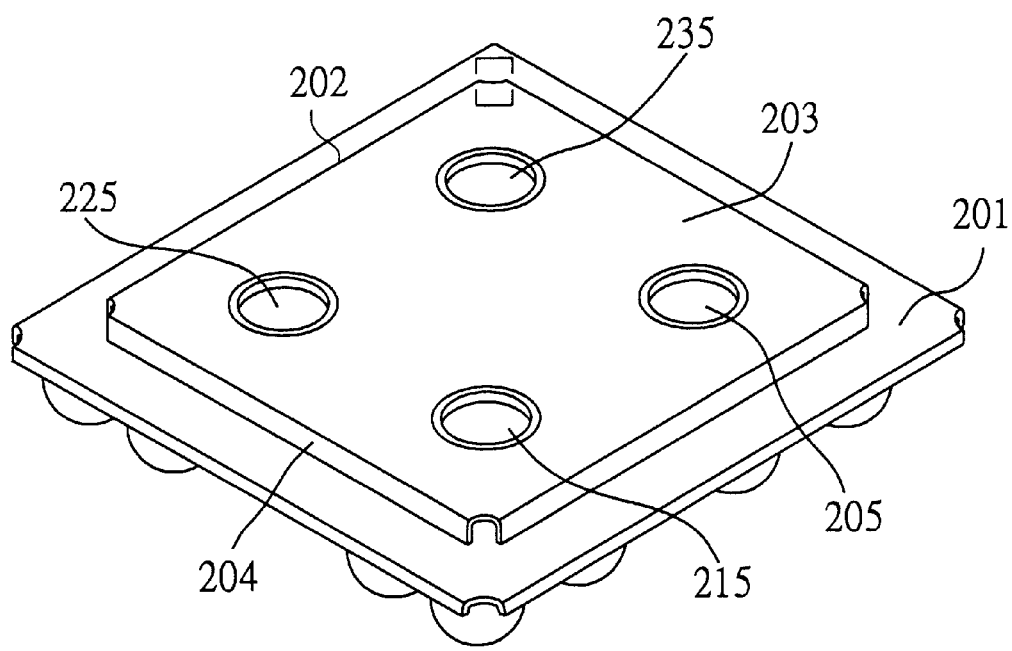
FIG. 2 illustrates a first embodiment of the extended flip-chip ball grid array package in accordance with the present invention.

FIG. 2 illustrates an extended flip-chip ball grid array package in accordance with a first embodiment of the present invention. The extended flip-chip ball grid array package comprises a semiconductor die (not visible in the drawings), a PBGA substrate panel 201 having top and bottom surfaces, and a heat slug 202 overlaying the die above the substrate panel 201. The semiconductor die is mounted substantially in the center of the upper surface of the substrate panel 201. As can be seen from FIG. 2, the heat slug 202 has a top plate 203 covering the die and four flanges 204 extending down to the substrate panel 201. Four contact bodies 205, 215, 225 and 235 are manufactured on the top plate 203 to bond the substrate panel 201 and the heat slug 202 together.

In the preferred embodiment, the contact bodies are formed near the corners of the top plate 203. Each contact body has a flat bottom for ensuring good contact between the heat slug 202 and the substrate panel 201. It may be manufactured by depressing the top plate 203 to form a hollow cylindrical structure with a flat bottom as shown in FIG. 2. The hollow cylindrical structure provides good support and protection for the semiconductor package to prevent it from being damaged by an external force. The good contact at the bottom allows heat to quickly transfer from the chip package to the heat slug 202 and thus assists the dissipation of heat generated from the chip package. Each contact body is preferably located near a corner of the die.

By having the externally attached heat slug, the extended flip chip BGA package of the invention protects chips from being cracked during testing or packaging the chip package. An identification mark may be easily applied to the chip package. If the heat slug 202 is connected to the ground of the chip circuit, it also provides electrical shielding for the circuit. The size of the flip-chip BGA package is identical to that of a standard PBGA. Standard equipment can be used to pick up and place the chip package during testing or assembling process of the chip package.

The warpage of a flip-chip BGA package can be controlled and adjusted by using appropriate material such as metal for the heat slug. Suitable materials for the heat slug include metal having good heat conductivity such as aluminum, copper, silver, etc. Copper is a preferred material because its coefficient of thermal expansion (CTE) is closer to that of the BGA substrate panel.

Figure 3:
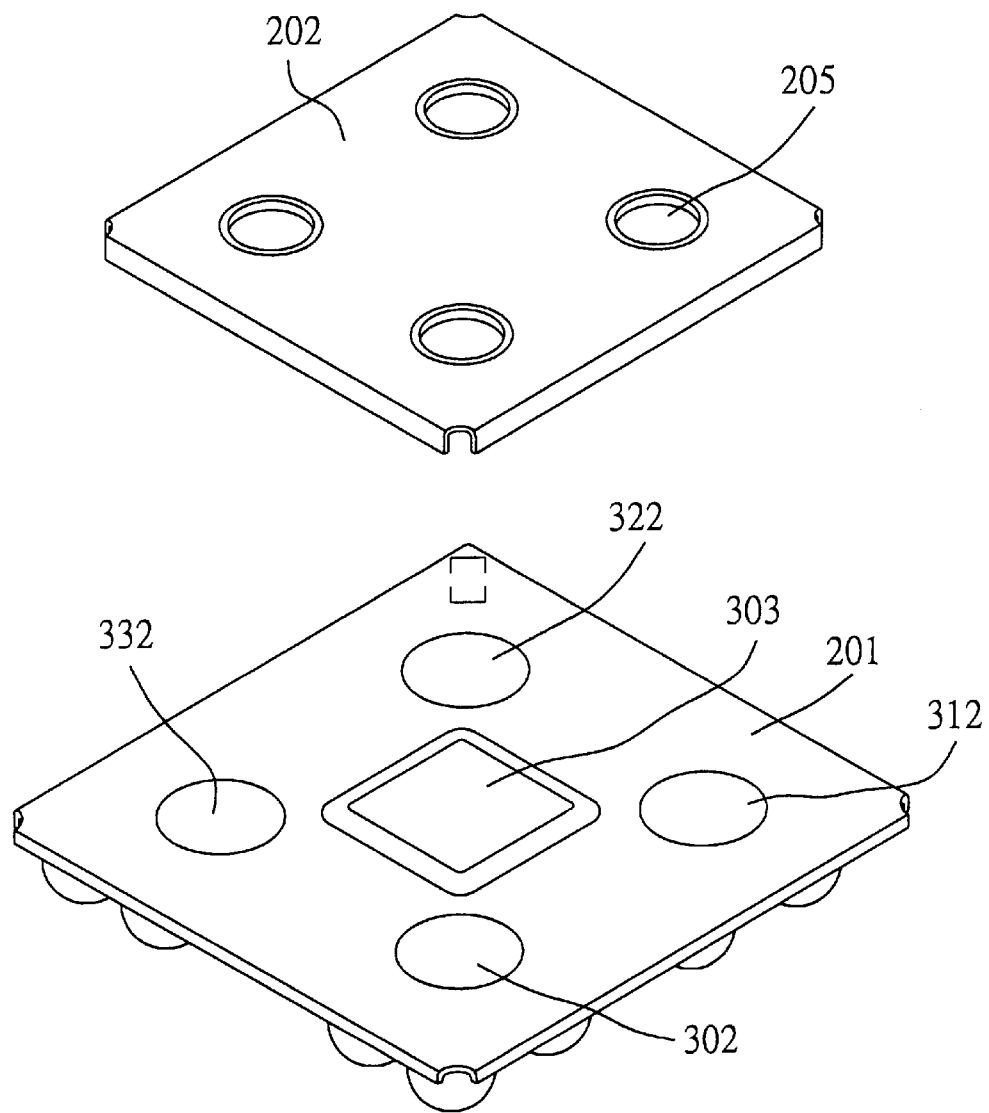
FIG. 3 illustrates how the first embodiment of the present invention is assembled.

FIG. 3 shows how the first embodiment of the present invention is assembled. In the assembling process, four contact pads 302, 312, 322 and 332 are first arranged on the top surface of the BGA substrate panel 201. Thermally conductive adhesive material is then applied on the four contact pads 302, 312, 322 and 332. Thermally conductive adhesive material is also applied to the upper surface of the die 303. Finally, a heat slug 202 having four contact bodies 205 overlays the top surface of the dies 303.

The adhesive materials which have been applied on the contact pads 302, 312, 322, 332 and the upper surface of the die 303 are cured to bond the heat slug 202, the die 303 and the substrate panel 201 to form the BGA chip package of the present invention. In general, epoxies having good heat conductivity are appropriate adhesive material for the bonding. The four contact pads on the top surface of the BGA substrate panel may be conductive and connected to the ground of the chip circuit for providing electrical shielding for the circuit. Under this circumstance, the adhesive material for bonding contact pads should also be electrically conductive.

Figure 4A:
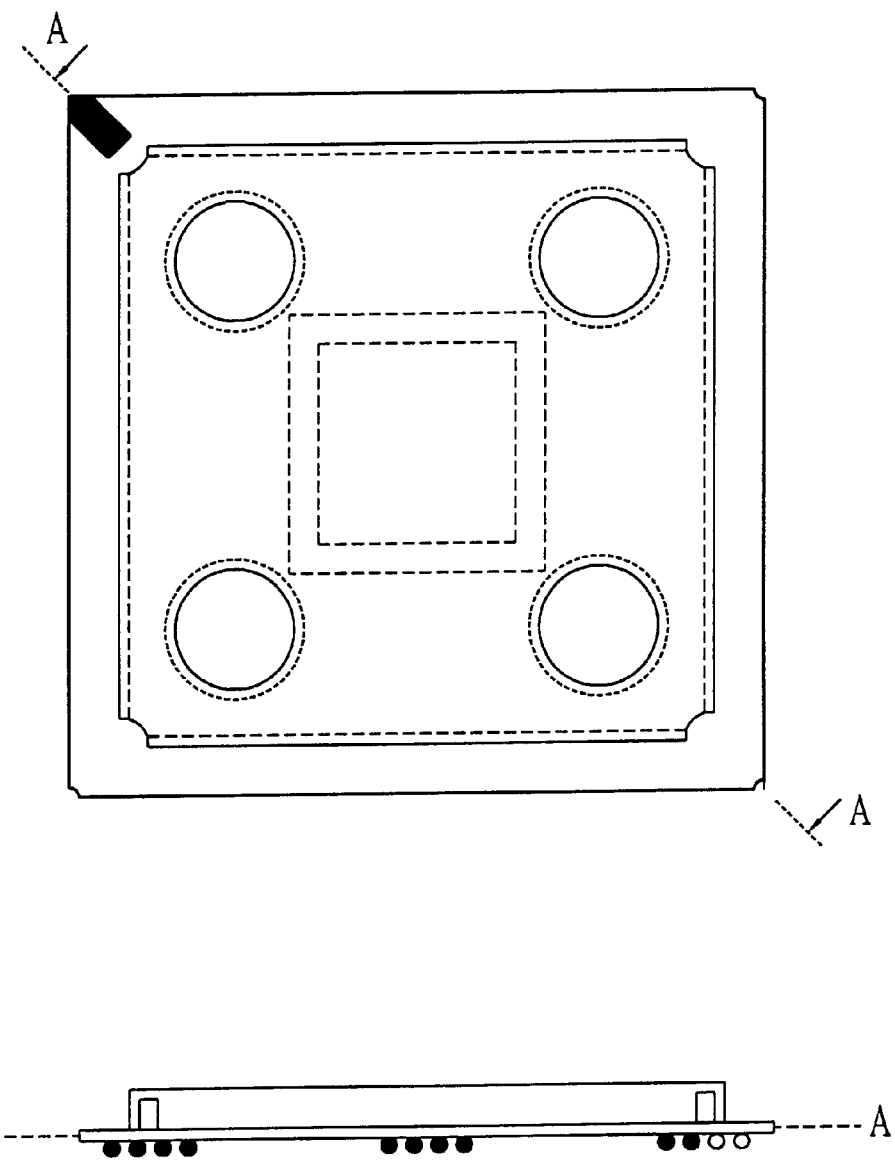
FIG. 4a shows the top view and various dimensions of an example of an extended flip-chip BGA chip package according to the first embodiment of the invention.
Figure 4B:
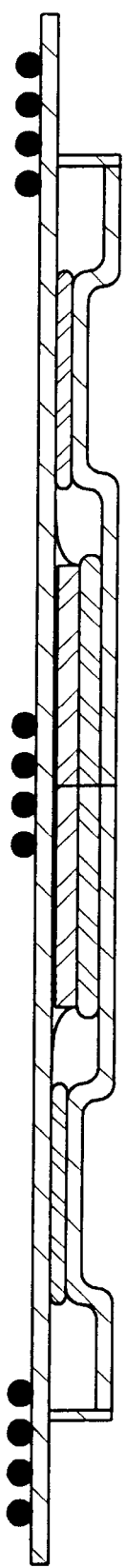

FIG. 4a shows the top view and various dimensions of an example of a BGA chip package according to the first embodiment of the invention. FIG. 4b shows its cross-sectional view. As can be seen from FIG. 4a, it is preferred that each contact body is manufactured near a corner of the substrate panel as well as a corner of the die.

Figure 5:
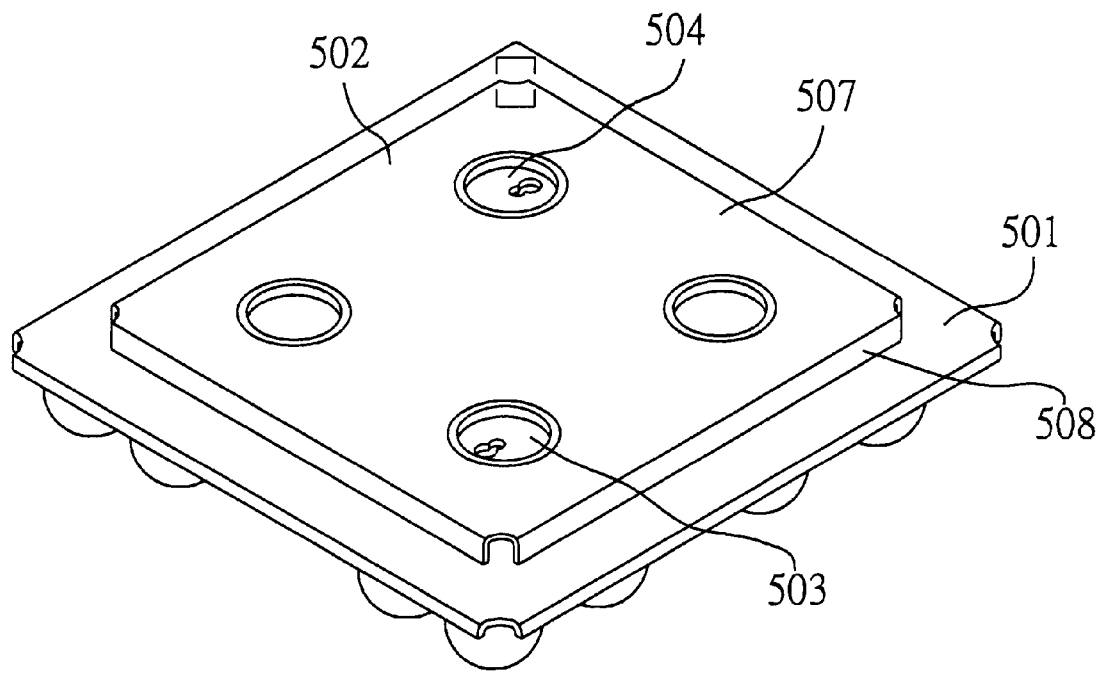
FIG. 5 illustrates a second embodiment of the flip-chip ball grid array package in accordance with the present invention.

FIG. 5 illustrates an alternative flip-chip ball grid array package according to a second embodiment of the present invention. In this embodiment, contact pads on the top surface of the BGA substrate panel are not formed. Instead, a supporting structure is bonded on the top surface of the BGA substrate panel. A heat slug overlaying the die is bonded thereon with the support of the supporting structure.

As shown in FIG. 5, a die (not visible in the drawing) is mounted to the upper surface of a BGA substrate panel 501. The die is covered with the metal heat slug 502 on which four contact bodies are manufactured. The heat slug is almost identical to that of the first embodiment except that in the two diagonal contact bodies 503 and 504, an opening is formed on each contact body. In the preferred embodiment, the opening comprises a smaller circular hole overlapped with a slightly bigger circular hole. Through the openings, the heat slug 502 can be fixed with the supporting structure when it is bonded to the die.

Similar to the first embodiment, the heat slug 502 overlaying the upper surface of the die has a top plate 507 covering the die and four flanges 508 extending down to the substrate panel 501. As can be seen from FIG. 5, the size of the flip-chip BGA package is same as that of a standard PBGA. Standard equipment can be used to pick up and place the chip package during testing or assembling process of the chip package.

In the second embodiment, no conductive adhesive material is applied on the contact pads to bond the heat slug and the substrate panel. Therefore, the second embodiment may have less structural stress between the BGA substrate panel and the heat slug. However, the first embodiment has a stronger bonding between the BGA substrate panel and the heat slug.

Figure 6:
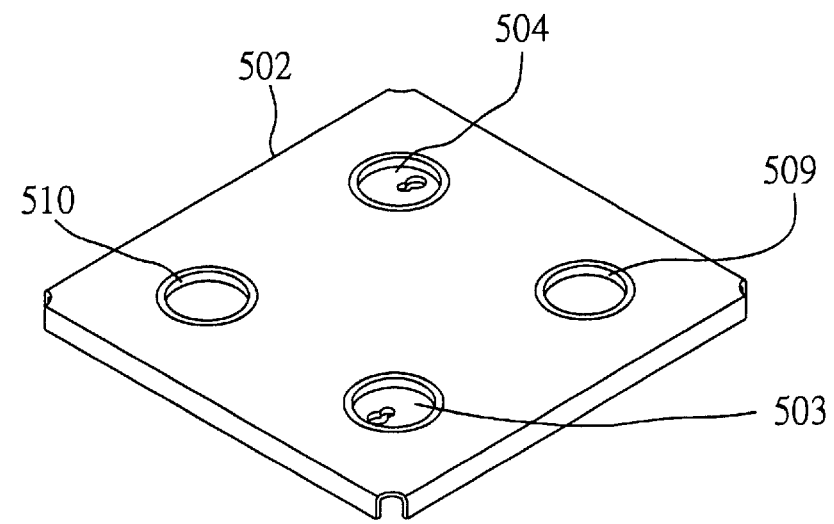
FIG. 6 illustrates how the second embodiment of the present invention is assembled.
Figure 6:
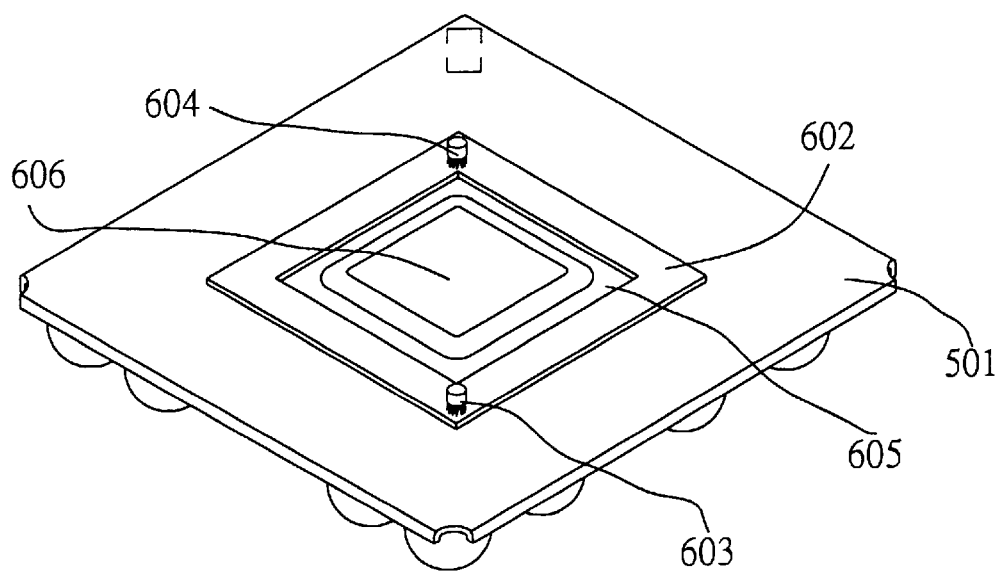

FIG. 6 illustrates how the second embodiment of the present invention is assembled. In the assembly process, a supporting structure 602 having two supporting stubs 603 and 604 is first bonded on the top surface of the BGA substrate panel 501 by using an adhesive material. As shown in FIG. 6, the example of the supporting structure 602 of the present invention has a rectangular shape. A central opening 605 for fully exposing the top surface of the die 606 is formed in the supporting structure 602. The two supporting stubs 603 and 604 are positioned near the corners of the supporting structure 602. Each supporting stub has a bigger head and a smaller body. The bigger head and smaller body of the supporting stub can barely pass through the bigger circular hole and the smaller circular hole respectively in the opening of a contact body 503 or 504.

Thermally conductive adhesive material is applied to the upper surface of the die 606. The heat slug 502 overlaying the upper surface of the extended flip chip BGA package is positioned properly for the supporting stubs to pass through the bigger circular holes in the openings of the contact bodies. The heat slug 502 is then rotated slightly so that the body of a supporting stub is snapped by the smaller circular hole in the opening of a contact body 503 or 504. The adhesive material on the top surface of the die 606 bonds the heat slug 502 and the die 606 together with the support of the supporting structure 602. The two contact bodies 509 and 510 help to stabilize the supporting structure 602 as well as the heat slug 502.

Figure 7A:
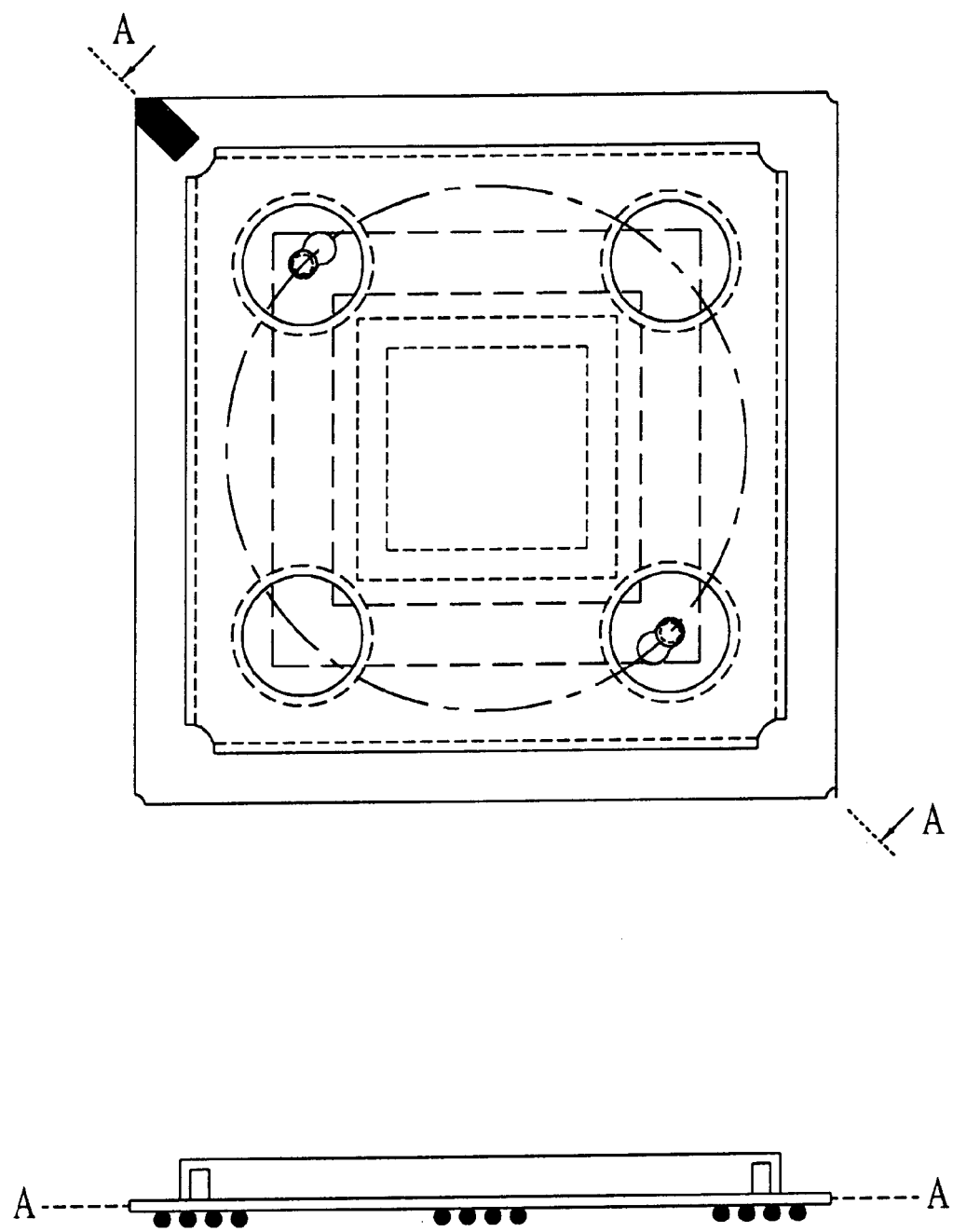
FIG. 7a shows the top view and various dimensions of an example of an extended flip-chip BGA chip package according to the second embodiment of the invention.
Figure 7B:
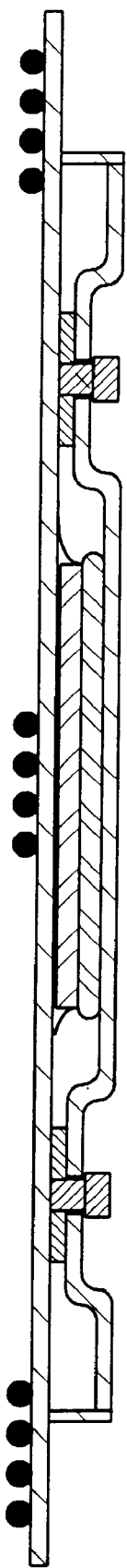

FIG. 7a shows the top view and various dimensions of an example of a BGA chip package according to the second embodiment of the invention. FIG. 7b shows its cross-sectional view. As can be seen from FIG. 7a, it is preferred that each contact body is manufactured near a corner of the substrate panel as well as a corner of the die.

Figure 8:
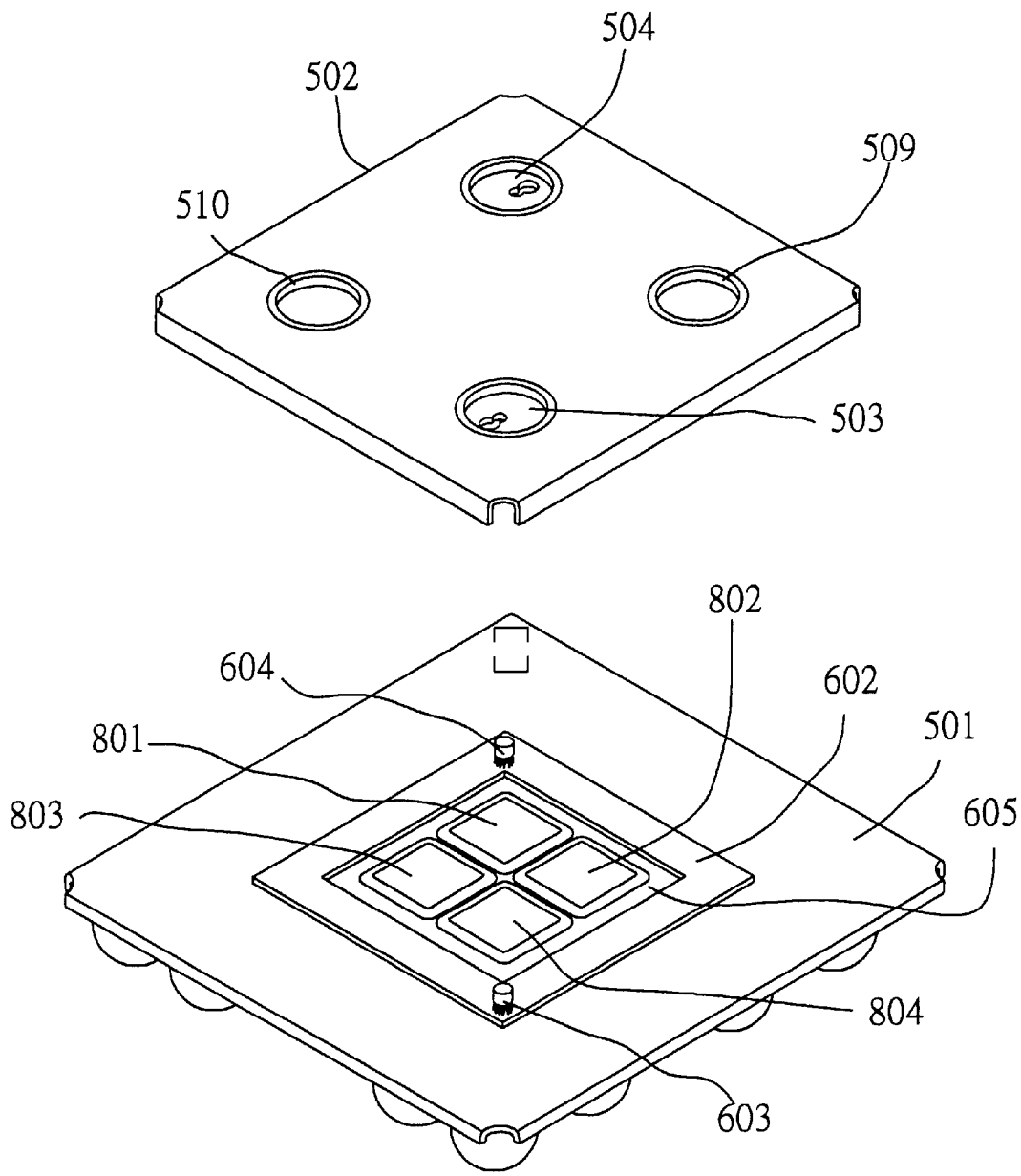
FIG. 8 illustrates a third embodiment of the flip-chip ball grid array package in accordance with the present invention.

FIG. 8 illustrates another flip-chip ball grid array package according to a third embodiment of the present invention. In this embodiment, instead of mounting a die in the center of the top surface of a BGA substrate panel, plural smaller dies are mounted substantially in the center of the top surface of the BGA substrate panel. As shown in FIG. 8, four smaller dies 801, 802, 803 and 804 are uniformly mounted in the center of the top surface of a BGA substrate panel and within the surrounding area of the supporting stubs shown in FIG. 6.

The technique of mounting multiple smaller dies on a substrate panel as shown in FIG. 8 may also be applied to the first embodiment. Within the area surrounded by the contact pads of the first embodiment, it may have multiple smaller dies uniformly mounted in the center of the top surface of a BGA substrate panel.

Although this invention has been described with a certain degree of particularity, it should be understood that the present disclosure has been made by way of preferred embodiments only. And, that numerous changes in the detailed construction and combination as well as arrangement of parts may be restored to without departing from the spirit or scope of the invention as hereinafter set forth.

What is claimed is:

1. A semiconductor chip package comprising:
    a ball grid array substrate panel having top and bottom surfaces, said bottom surface having a plurality of solder balls attached thereon;
    at least one semiconductor chip being mounted substantially in the center of said top surface of said substrate panel;
    a plurality of contact pads formed on said top surface of said substrate panel, each of said contact pads being located near a corner of said semiconductor chip; and
    a heat slug having a top plate covering said semiconductor chip and a plurality of flanges extending down to said substrate panel, said top plate having a plurality of hollow cylindrical contact bodies each having a flat bottom for providing close contact with a corresponding contact pad and bonding said heat slug to said substrate panel;
    wherein said top plate is bonded to said semiconductor chip by means of a first adhesive material, and said heat slug is bonded to said contact pads on said substrate panel by means of a second adhesive material.

2. The semiconductor chip package according to claim 1, said first adhesive material being thermally conductive.

3. The semiconductor chip package according to claim 1, said heat slug being electrically connected to said substrate for providing electrical shielding effect.

4. The semiconductor chip package according to claim 3, said second adhesive material being electrically conductive.

5. The semiconductor chip package according to claim 1, said heat slug being made of metal.

6. The semiconductor chip package according to claim 1, said heat slug being thermally conductive.

7. The semiconductor chip package according to claim 1, said semiconductor chip package being a flip chip ball grid array package.

8. A semiconductor chip package comprising:
    a ball grid array substrate panel having top and bottom surfaces, said bottom surface having a plurality of solder balls attached thereon;
    at least one semiconductor chip being mounted substantially in the center of said top surface of said substrate panel;
    a supporting structure being bonded on said top surface of said substrate panel, said supporting structure having a central opening for fully exposing a top surface of said semiconductor chip and at least two supporting stubs each being located near a corner of said supporting structure; and
    a heat slug having a top plate covering said semiconductor chip and a plurality of flanges extending down to said substrate panel, said top plate being bonded to said semiconductor chip by means of an adhesive material, said top plate further having at least two contact bodies each having an opening, and said supporting stubs being snapped in the openings of said contact bodies for fixing said heat slug to said substrate panel.

9. The semiconductor chip package according to claim 8, said adhesive material being thermally conductive.

10. The semiconductor chip package according to claim 8, said heat slug being electrically connected to said substrate for providing electrical shielding effect.

11. The semiconductor chip package according to claim 8, said heat slug being made of metal.

12. The semiconductor chip package according to claim 8, said heat slug being thermally conductive.

13. The semiconductor chip package according to claim 8, said heat slug being thermally conductive.

14. The semiconductor chip package according to claim 8, said semiconductor chip package being a flip chip ball grid array package.

15. The semiconductor chip packages according to claim 8, said contact bodies each having a hollow interior and a flat bottom.

16. The semiconductor chip packages according to claim 8, at least two of said supporting stubs being positioned at two diagonal corners of said supporting structure.

17. The semiconductor chip packages according to claim 16, said top plate of said heat slug further having at least two contact bodies formed near another two diagonal corners of said supporting structure.

* * * * *

US006166435C1

(12) EX PARTE REEXAMINATION CERTIFICATE (10501st)
United States Patent
Leu et al.

(10) Number: US 6,166,435 C1
(45) Certificate Issued: Feb. 11, 2015

(54) FLIP-CHIP BALL GRID ARRAY PACKAGE WITH A HEAT SLUG

(75) Inventors: Fang-Jun Leu, Hsinchu (TW);
Rong-Shen Lee, Hsinchu (TW);
Hsin-Chien Huang, Hsinchu (TW);
Randy Hsiao-Yu Lo, Taipei (TW);
Chiang-Han Day, Hsinchu (TW)

(73) Assignee: Industrial Technology Research Institute, Chutung, Hsinchu (TW)

Reexamination Request:
No. 90/012,715, Nov. 2, 2012

Reexamination Certificate for:
Patent No.: 6,166,435
Issued: Dec. 26, 2000
Appl. No.: 09/209,634
Filed: Dec. 10, 1998

(51) Int. Cl.
*H01L 23/12* (2006.01)

(52) U.S. Cl.
USPC ........... 257/704; 257/707; 257/706; 257/718; 257/720; 257/719; 257/780

(58) Field of Classification Search
USPC .............................. 257/704, 707, 6, 718–720
See application file for complete search history.

(56) References Cited

To view the complete listing of prior art documents cited during the proceeding for Reexamination Control Number 90/012,715, please refer to the USPTO's public Patent Application Information Retrieval (PAIR) system under the Display References tab.

*Primary Examiner* — Leonardo Andujar

(57) ABSTRACT

An extended flip chip ball grid array package includes a metal heat slug bonded to the surface of a semiconductor chip. The heat slug has a bonding structure for connecting itself and a BGA substrate panel on which the semiconductor chip is mounted. The heat slug protects the chip from being damaged as well as assists heat dissipation. A first package assembly provides contact bodies on the heat slug for bonding the heat slug to contact pads formed on a BGA substrate panel. A second package assembly fixes the heat slug to a supporting structure bonded on a BGA substrate panel. Supporting stubs are formed on the supporting structure and snapped in openings formed on the contact bodies of the heat slug. Conventional packaging or testing equipment can be used for both package assemblies to manufacture or test the semiconductor chip packages.

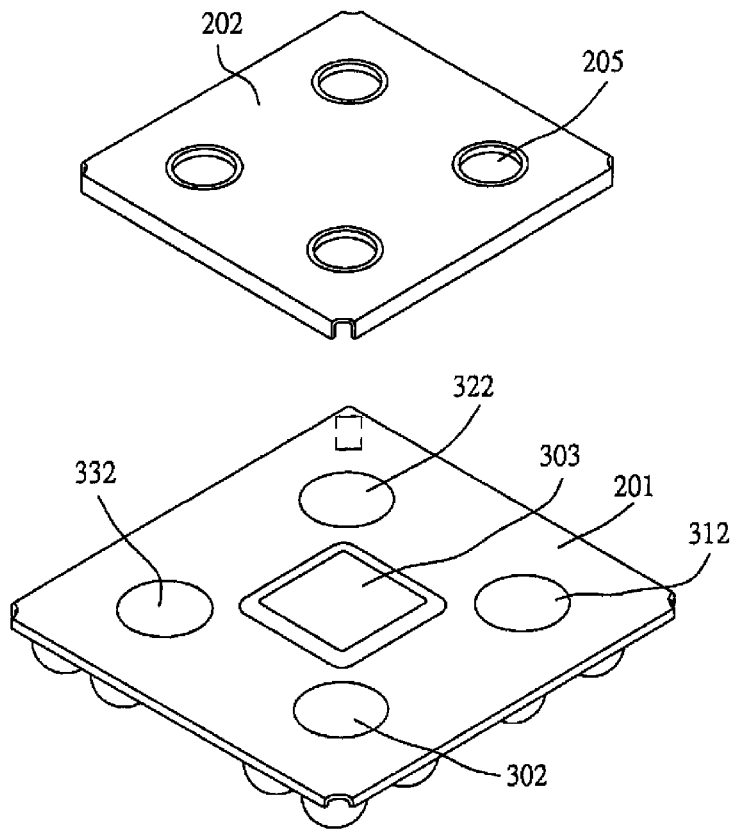

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 7 are cancelled.

Claims 2, 5 and 6 are determined to be patentable as amended.

New claim 18 is added and determined to be patentable.

Claims 3, 4 and 8-17 were not reexamined.

2. The semiconductor *flip* chip *ball grid array* package according to claim [1] *18*, said first adhesive material being thermally conductive.

5. The semiconductor *flip* chip *ball grid array* package according to claim [1] *18*, said heat slug being made of metal.

6. The semiconductor *flip* chip *ball grid array* chip package according to claim [1] *18*, said heat slug being thermally conductive.

*18. A semiconductor flip chip ball grid array package comprising:*

*a ball grid array substrate panel having top and bottom surfaces, said bottom surface having a plurality of solder balls attached thereon;*

*at least one semiconductor chip being mounted substantially in the center of said top surface of said substrate panel;*

*a plurality of contact pads formed on said top surface of said substrate panel, each of said contact pads being located near a corner of said semiconductor chip; and*

*a heat slug having a top plate covering said at least one semiconductor chip and a plurality of flanges extending down to said substrate panel, said top plate having a plurality of hollow cylindrical contact bodies each having a flat bottom for providing close contact with a corresponding contact pad and bonding said heat slug to said substrate panel;*

*wherein said top plate is bonded to said at least one semiconductor chip by means of a first adhesive material, and said heat slug is bonded to said contact pads on said substrate panel by means of a second adhesive material, said first and second adhesives bonding said heat slug to said at least one semiconductor chip and to said substrate plate without said at least one semiconductor chip or said heat slug being encapsulated by said adhesives or any additional material.*

\* \* \* \* \*